(12) United States Patent
Bhattacharya et al.

(10) Patent No.: US 7,145,364 B2
(45) Date of Patent: Dec. 5, 2006

(54) SELF-BYPASSING VOLTAGE LEVEL TRANSLATOR CIRCUIT

(75) Inventors: Dipankar Bhattacharya, Macungie, PA (US); Makeshwar Kothandaraman, Whitehall, PA (US); John C. Kriz, Palmerton, PA (US); Bernard L. Morris, Emmaus, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 156 days.

(21) Appl. No.: 11/065,785

(22) Filed: Feb. 25, 2005

(65) Prior Publication Data
US 2006/0192587 A1    Aug. 31, 2006

(51) Int. Cl.
*H03K 19/0175* (2006.01)

(52) U.S. Cl. ............................. 326/68; 326/38; 326/81; 326/83

(58) Field of Classification Search .................. 326/37, 326/38, 63, 68, 80–86
See application file for complete search history.

(56) References Cited

U.S. PATENT DOCUMENTS

| 5,534,798 | A  | * | 7/1996  | Phillips et al. ............... 326/108 |
| 6,960,953 | B1 | * | 11/2005 | Ichihara ....................... 327/333 |
| 2003/0141911 | A1 | * | 7/2003 | Steiss et al. ................ 327/202 |

* cited by examiner

*Primary Examiner*—Don Le

(57) ABSTRACT

A voltage level translator circuit is selectively operable in one of at least two modes in response to a control signal. In a first mode, the voltage level translator circuit is operative to translate an input signal referenced to a first source providing a first voltage to an output signal referenced to a second source providing a second voltage. In a second mode, the voltage level translator circuit is operative to provide a signal path from an input of the voltage translator circuit to an output thereof without translating the input signal. The control signal is indicative of a difference between the first voltage and the second voltage.

20 Claims, 4 Drawing Sheets

SELF-BYPASSING VOLTAGE LEVEL TRANSLATOR CIRCUIT

FIELD OF THE INVENTION

The present invention relates generally to electronic circuits, and more particularly relates to voltage level translator circuits.

BACKGROUND OF THE INVENTION

Certain portable devices, including wireless handsets, notebook computers and personal digital assistants (PDAs), often employ circuitry which runs on two or more different voltage levels. For instance, circuitry utilized with such portable devices may be configured so that a portion of the circuitry, such as, for example, input/output (IO) buffers, runs at a higher voltage level (e.g., about 3.3 volts), as may be supplied by an IO voltage source, while another portion of the circuitry, such as, for example, core logic, runs at a substantially lower voltage level (e.g., about 1.0 volt), as may be supplied by a core voltage source. This difference in voltage levels often necessitates the use of a voltage level translator circuit for interfacing between the multiple voltage levels.

There are many applications in which a circuit (e.g., an IO buffer) may be required to operate over a wide range of IO voltage source levels. The level of the IO voltage source may be determined by the particular application. From a performance standpoint (e.g., speed, power consumption, reliability, etc.), it is generally preferable to manufacture multiple circuits, each circuit being individually optimized for a specific expected IO voltage source level of operation. However, this approach significantly increases the cost of both design and fabrication of the circuits, and is thus undesirable. Consequently, such circuits are typically designed to handle a wide range of IO voltage source levels, at the expense of circuit performance. It is well known that when the IO voltage source level becomes comparable to the core voltage source level, a standard voltage level translator circuit often produces an undesirable amount of skew and operates at a substantially slower speed. Thus, in a conventional voltage level translator circuit, a trade-off exists between circuit performance and cost.

There exists a need, therefore, for an improved voltage level translator circuit for interfacing between multiple voltage levels that does not suffer from one or more of the problems exhibited by conventional voltage level translator circuits.

SUMMARY OF THE INVENTION

The present invention meets the above-noted need by providing, in an illustrative embodiment, a voltage translator circuit capable of interfacing between multiple voltage levels, such as, for example, between an input signal, which is referenced to a lower core voltage supply of the circuit, and an output signal, which is referenced to a higher voltage supply of the circuit. Based at least in part on a difference between the higher voltage supply and the lower core voltage supply, the voltage translator circuit is advantageously configured to either translate the input signal or to provide a direct path from input to output without voltage level translation.

In accordance with one embodiment of the invention, a voltage level translator circuit is selectively operable in one of at least two modes in response to a control signal. In a first mode, the voltage level translator circuit is operative to translate an input signal referenced to a first source providing a first voltage to an output signal referenced to a second source providing a second voltage. In a second mode, the voltage level translator circuit is operative to provide a signal path from an input of the voltage translator circuit to an output thereof without translating the input signal. The control signal is indicative of a difference between the first voltage and the second voltage. The voltage level translator circuit may include a voltage detector operative to measure the difference between the first voltage and the second voltage and to generate the control signal.

In accordance with another embodiment of the invention, at least one of the above voltage level translator circuits is comprised in an integrated circuit.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative voltage level translator circuits. It should be understood, however, that the present invention is not limited to these or any other particular circuit arrangements. Rather, the invention is more generally applicable to techniques for interfacing between multiple voltage levels in a circuit without suffering any significant degradation in circuit performance over a desired range of supply voltage levels, particularly when a higher voltage supply, to which the output signal of the circuit is referenced, is substantially close in value to a lower core supply, to which an input signal to the circuit is referenced. Although implementations of the present invention are described herein with specific reference to P-channel metal-oxide-semiconductor (PMOS) and N-channel metal-oxide-semiconductor (NMOS) transistor devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1:
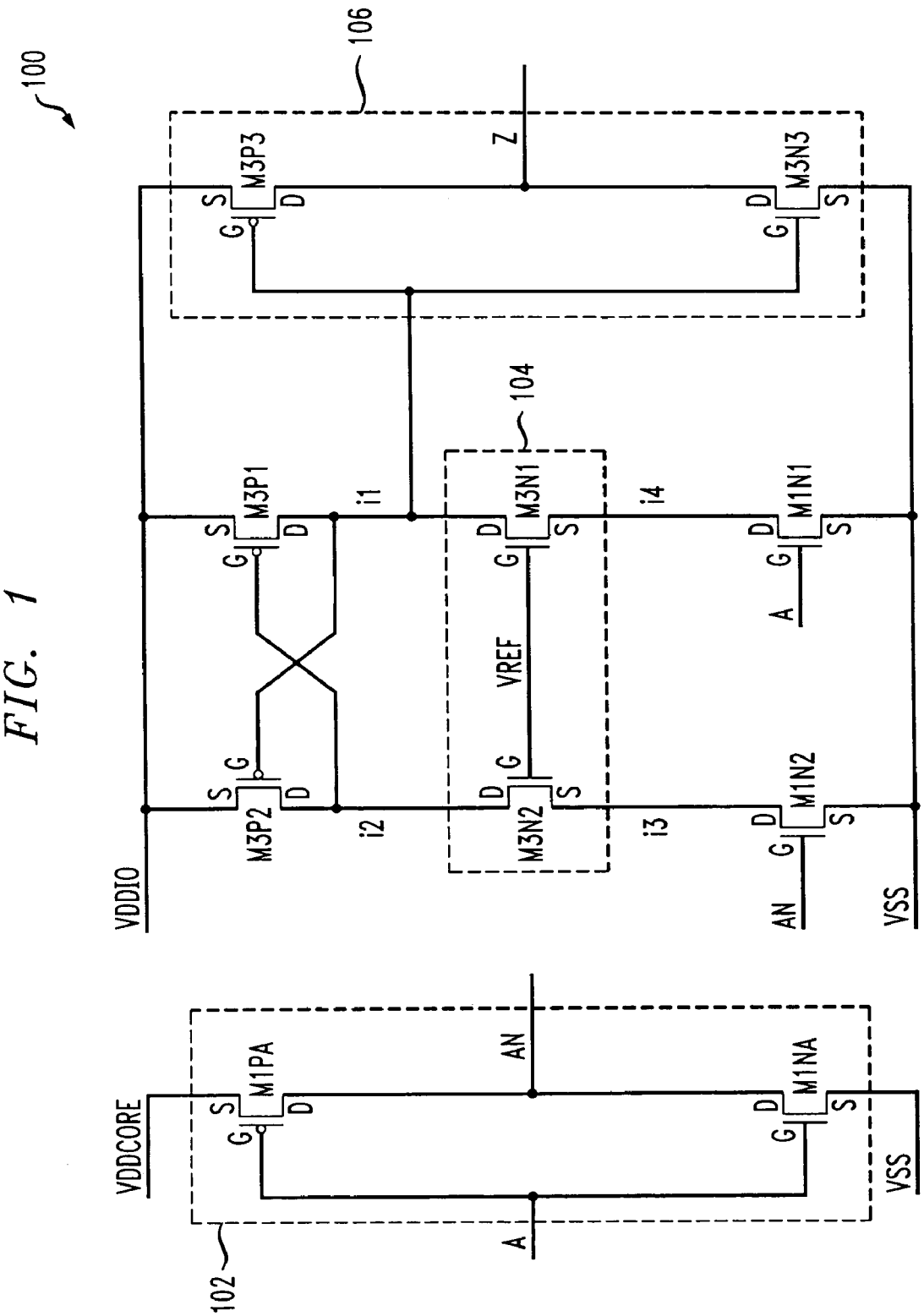
FIG. 1 is a schematic diagram illustrating a voltage level translator circuit which can be modified to incorporate the techniques of the present invention.

FIG. 1 illustrates a voltage level translator circuit 100 in which the techniques of the present invention can be implemented. The voltage level translator circuit 100 can be used to translate input signals (e.g., signals A and AN) referenced to a lower core supply voltage, such as, for example, VDDCORE, to an output signal Z which is referenced to a higher supply voltage, such as, for example, VDDIO. In many applications, the lower core supply voltage VDDCORE is typically about 1.0 volt and the higher supply voltage VDDIO is typically about 3.3 volts. It is to be appreciated, however, that the present invention is not limited to these or to any other particular voltage levels for VDDCORE and VDDIO. Furthermore, the techniques of the present invention may be similarly employed to translate an input signal referenced to the higher supply voltage VDDIO to an output signal referenced to the lower core supply voltage VDDCORE, as will be understood by those skilled in the art.

Traditional mixed signal integrated circuit processes typically offer "high voltage" and "low voltage" transistor devices. The high voltage devices generally have a nominal threshold voltage of about 0.75 volts and are intended to operate with the higher supply voltage VDDIO (e.g., about 3.3 volts). The low voltage devices have a nominal threshold voltage which is substantially lower than the high voltage devices, such as, for example, about 0.35 volts, and are intended to operate with the lower core supply voltage VDDCORE (e.g., about 1.0 volt).

Input signal AN is a logical inversion of input signal A, such that when signal A is a logic high level, signal AN is a logic low level, and vice versa. Signals A and AN may be generated, for example, by an inverter 102 including a low voltage PMOS transistor M1PA and a low voltage NMOS transistor device M1NA connected in a conventional manner. The inverter 102 is powered by the lower core supply VDDCORE and receives, as its negative supply, VSS. The voltage level translator circuit 100 is powered by higher supply voltage VDDIO and receives, as its negative voltage supply, VSS. The term "negative voltage supply" as used herein is intended to refer to a value of the voltage supply relative to VDDIO or VDDCORE, and does not necessarily refer to a voltage less than zero volts, although using a voltage less than zero volts is contemplated by the invention.

The voltage level translator circuit 100 comprises a pair of high voltage PMOS transistor devices M3P1 and M3P2, each device having a source terminal (S) connected to VDDIO, and having a gate terminal (G) of one transistor connected to a drain terminal (D) of the other transistor in a cross-coupled arrangement. Specifically, the gate terminal of M3P1 is connected to the drain terminal of M3P2 at node i2, and the gate terminal of M3P2 is connected to the drain terminal of M3P1 at node i1. Transistors M3P1 and M3P2 are preferably operative to latch a logical state of the voltage level translator circuit 100. It is to be appreciated that, because a metal-oxide-semiconductor (MOS) device is symmetrical in nature, and thus bi-directional, the assignment of source and drain designations in the MOS device is essentially arbitrary. Therefore, the source and drain regions may be referred to herein generally as first and second source/drain regions, respectively, where "source/drain" in this context denotes a source region or a drain region.

The voltage level translator circuit 100 further comprises a pair of low voltage NMOS transistor devices M1N1 and M1N2 having gate terminals for receiving input signals A and AN, respectively. Source terminals of M1N1 and M1N2 are preferably connected to VSS, and drain terminals of M1N1 and M1N2 are connected to the drain terminals of transistors M3P1 and M3P2, respectively, via a voltage clamp circuit 104. The voltage clamp circuit 104 preferably comprises a pair of high-voltage NMOS transistors M3N1 and M3N2. Specifically, the drain terminals of M1N1 and M1N2 are connected to source terminals of M3N1 and M3N2 at nodes i4 and i3, respectively. Drain terminals of M3N1 and M3N2 are connected to the drain terminals of M3P1 and M3P2 at nodes i1 and i2, respectively, and gate terminals of M3N1 and M3N2 are connected to a reference source providing a bias voltage VREF for clamping the drain voltage at nodes i3 and i4 to a desired voltage level. Since M1N1 and M1N2 are low voltage devices, they are generally not able to withstand the higher supply voltage VDDIO, the voltage clamp circuit 104 provides a voltage level at nodes i1 and i2 which protects M1N1 and M1N2 from damage due to over-voltage stress. An output stage 106 comprising high voltage PMOS transistor M3P3 and high voltage NMOS transistor M3N3 connected together as a standard inverter, is preferably connected to node i1 and generates an output signal Z of the voltage level translator circuit 100.

Figure 2:
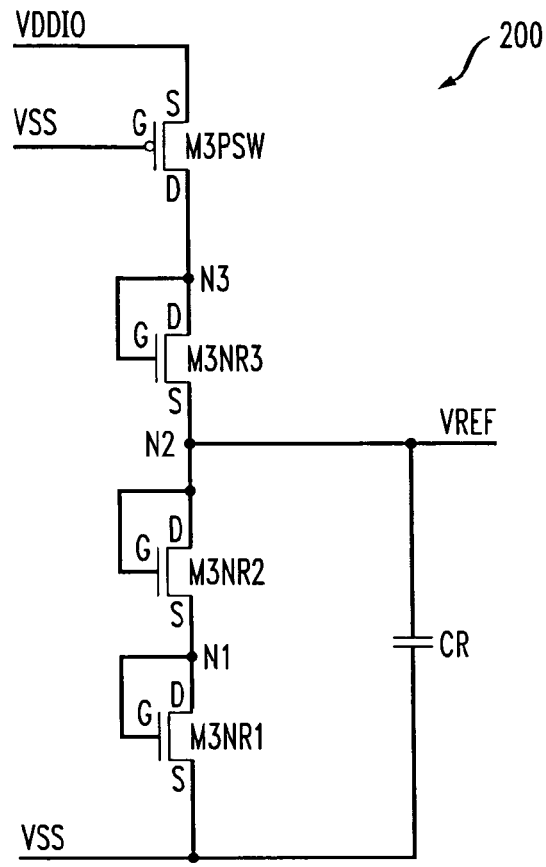
FIG. 2 is a schematic diagram depicting a reference circuit suitable for use with the voltage level translator circuit shown in FIG. 1

FIG. 2 illustrates an exemplary reference circuit 200 suitable for use with the voltage level translator circuit 100 shown in FIG. 1. The reference circuit 200 is operative for providing the bias voltage VREF used to clamp the voltage appearing at nodes i3 and i4 of the voltage level translator circuit 100. As apparent from FIG. 2, the exemplary reference circuit 200 may be implemented as simple voltage divider circuit including three diode-connected high voltage NMOS transistor devices, namely, M3NR1, M3NR2 and M3NR3, arranged in a stacked configuration. Specifically, gate and drain terminals of M3NR1 are connected to a source terminal of M3NR2 at node N1, a source terminal of M3NR1 is connected to VSS, gate and drain terminals of M3NR2 are connected to a source terminal of M3NR3 at node N2, and gate and drain terminals of M3NR3 are connected together at node N3. Node N3 is connected to VDDIO through a resistance implemented as a high voltage PMOS transistor device M3PSW having a drain terminal connected to node N3, a source terminal connected to VDDIO and a gate terminal connected to VSS. Transistor M3PSW is preferably a long channel device so as to limit the direct current (DC) power consumption in the reference circuit 200. The reference voltage VREF is generated at node N2. In order to reduce noise which may be introduced in the bias voltage VREF at node N2, a capacitor CR may be included between node N2 and VSS. The value of capacitor CR is preferably chosen as a function of the desired frequency components to be attenuated.

As previously stated, one disadvantage with the voltage level translator circuit 100 of FIG. 1 is that when a difference between the higher supply voltage VDDIO and the lower core voltage VDDCORE becomes substantially small (e.g., less than about 0.7 volt), the circuit often produces an undesirable amount of skew and operates at a substantially slower speed, compared to when the difference between VDDIO and VDDCORE is substantially large (e.g., greater than about one volt). For a standard voltage level translator, without a voltage clamp circuit (e.g., 104) and corresponding reference circuit (e.g., 200), the output of the translator circuit will be substantially slow when VDDIO is within about a transistor threshold voltage of VDDCORE. For the translator circuit of FIG. 1, however, the circuit essentially stops functioning altogether. Thus, in accordance with one aspect of the invention, a voltage level translator circuit is provided which is selectively operable in one of at least two modes in response to one or more control signals. In a first mode, wherein the difference between VDDIO and VDDCORE is greater than a specified level, the circuit is operative to translate an input signal, which is referenced to the lower core voltage VDDCORE, to an output signal referenced to the higher voltage VDDIO. In a second mode, wherein the difference between VDDIO and VDDCORE is less than or equal to a specified level, the voltage level translator circuit is advantageously operative to provide a direct signal path from an input of the circuit to an output thereof without translating the input signal, thereby essentially bypassing the voltage level translator circuit. By providing a mechanism for bypassing the voltage level translation function when VDDIO is comparable to VDDCORE (e.g., when voltage level translation is not required), skew is beneficially reduced and speed is increased in the voltage level translator circuit.

Figure 3:
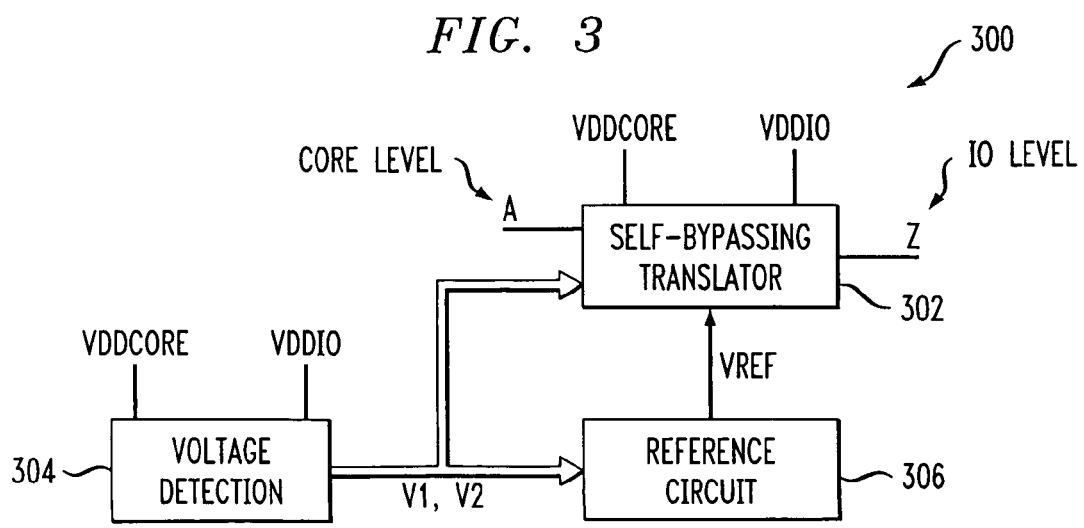
FIG. 3 is a block diagram illustrating an exemplary self-bypassing voltage level translator circuit, formed in accordance with one embodiment of the present invention.

FIG. 3 is a block diagram depicting an exemplary voltage level translator circuit 300, formed in accordance with an illustrative embodiment of the present invention. The exemplary voltage level translator circuit 300 is operative in one of at least two modes of operation. When in a first mode of operation, a self-bypassing translator 302 in the voltage level translator circuit 300 functions primarily to translate an input signal A referenced to a first source providing a first voltage, which in this instance is VDDCORE (e.g., core level), to an output signal Z referenced to a second source providing a second voltage, which in this instance is VDDIO (IO level), where VDDIO is substantially greater than VDDCORE. In a preferred embodiment of the invention, VDDIO is about 3.3 volts and VDDCORE is about 1.0 volt. In a second mode of operation of the voltage level translator circuit 300, a direct signal path is preferably provided between the input and the output of the circuit, without voltage level translation. In the second mode, the translator 302 in the voltage level translator circuit 300 is preferably disabled. This second mode may thus be considered a bypass mode.

The particular mode of operation of the voltage level translator circuit 300 is preferably selected in response to one or more control signals, for example V1 and V2, generated by the translator circuit itself. Consequently, the voltage level translator circuit 300 may be said to be self-bypassing, as previously stated. The control signals V1, V2 are preferably a function of a difference between the two supply voltages VDDIO and VDDCORE.

The exemplary voltage level translator circuit 300 includes a voltage detection circuit 304 for generating the control signals V1 and V2 used to selectively control the mode of operation of the translator circuit. The voltage detection circuit 304 is preferably operative to compare the first and second voltages, VDDCORE and VDDIO, respectively, and to generate control signals V1 and V2 which are representative of whether or not VDDIO is less than a desired amount above VDDCORE. In a preferred embodiment of the invention, voltage detection circuit 304 is configured such that control signals V1, V2 indicate whether or not VDDIO is less than about a transistor threshold voltage (e.g., about 0.75 volt) above VDDCORE. It is to be understood, however, that the present invention is not limited to detecting any particular voltage difference between the first and second sources, nor is it limited to detecting a voltage difference between only two sources. The voltage level translator circuit 300 preferably utilizes the control signals V1, V2 to selectively bypass the translator 302, as previously described.

A reference circuit 306 may be included in the voltage level translator circuit 300 for providing a bias signal VREF for the translator circuit, as will be explained below. The bias signal VREF may be used, for example, by a voltage clamp included in the voltage level translator circuit 300 for limiting a voltage appearing on an input stage of the translator circuit, in a manner similar to the voltage level translator circuit 100 shown in FIG. 1. Although shown as separate functional blocks, one or more blocks may be integrated with one or more other functional blocks, with or without modification thereto, as will be apparent to those skilled in the art. For example, reference circuit 306 may be combined with the self-bypassing translator 302.

Figure 4:
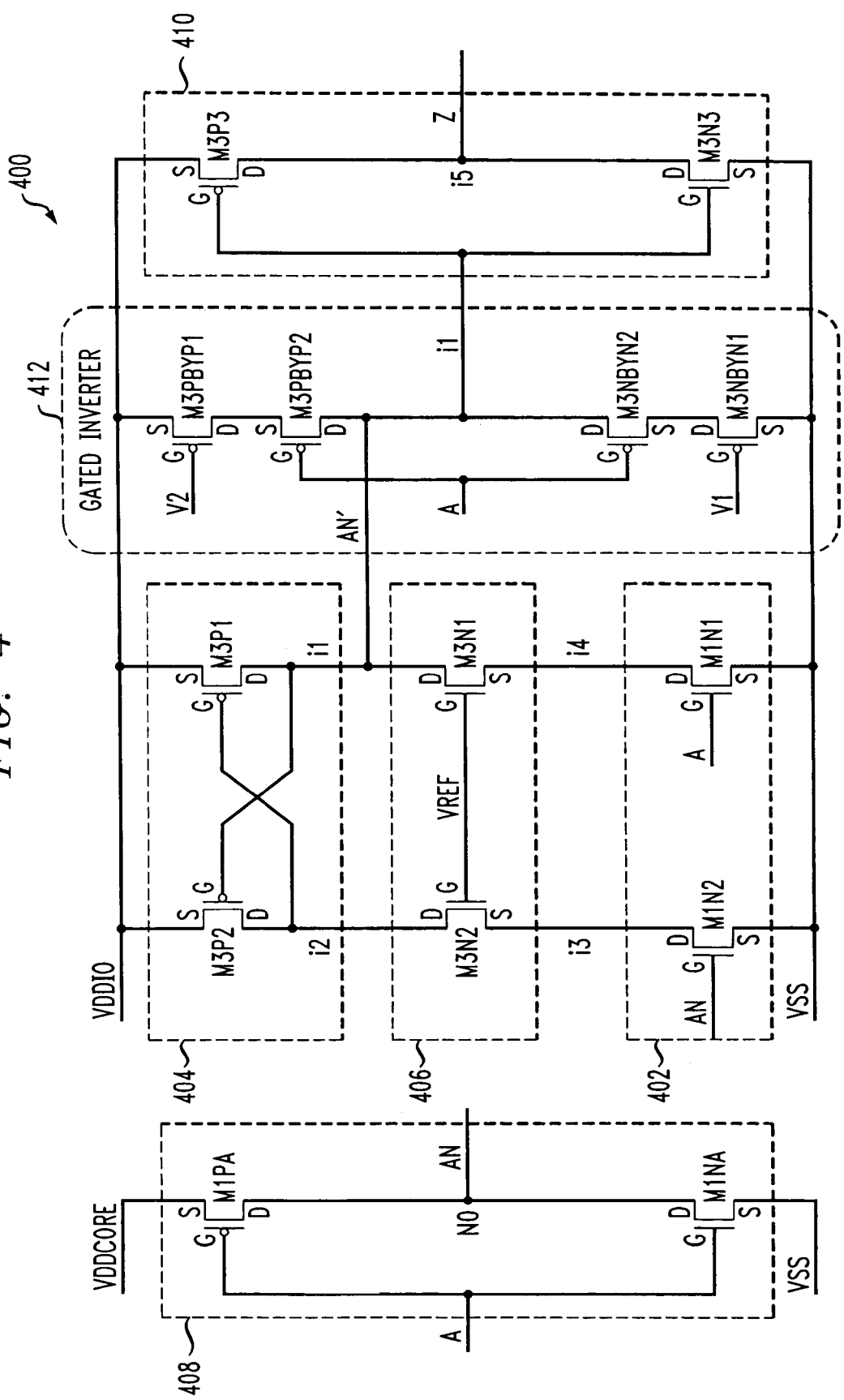
FIG. 4 is a schematic diagram illustrating an exemplary voltage translator cell suitable for use with the voltage level translator circuit shown in FIG. 3.

FIG. 4 is a schematic diagram depicting an exemplary self-bypassing translator circuit 400, formed in accordance with one embodiment of the invention. The exemplary translator circuit 400 includes an input stage 402 configured for receiving at least one input signal (e.g., signal A) which is referenced to a lower core supply voltage VDDCORE, and a latch circuit 404 for at least temporarily storing an output signal which is referenced to a higher supply voltage VDDIO and is representative of a logical state of the input signal. In many applications, the lower core supply voltage VDDCORE is typically about 1.0 volt and the higher supply voltage VDDIO is typically about 3.3 volts. It is to be appreciated, however, that the present invention is not limited to these or to any other particular voltage levels for VDDCORE and VDDIO. A voltage clamp 406 is operatively coupled between the input stage 402 and the latch circuit 404, the voltage clamp functioning, at least in part, to limit a voltage appearing across the input stage. The translator circuit 400 may also include an output stage 410 coupled to the latch circuit 404 for buffering the output signal stored in the latch circuit and for generating a buffered output signal (e.g., signal Z) of the translator circuit having substantially rail-to-rail (e.g., VSS to VDDIO) logic levels.

Input signal A is preferably supplied to an inverter 408, which may or may not be considered a part of the translator circuit 400, comprising low voltage PMOS and NMOS transistors M1PA and M1NA, respectively, configured as a standard inverter. Inverter 408 generates signal AN at node N0 which is a logical complement of input signal A. Signals A and AN are core logic signals referenced with respect to the lower core supply VDDCORE.

Input stage 402 is preferably configured for receiving two input signals, namely, signals A and AN, and may therefore be referred to as a differential input stage. It is to be appreciated that in a single-ended mode of operation, input stage 402 may be operative to receive only one of the input signals A or AN. While the translator circuit 400 is not limited to a particular input stage configuration, input stage 402 preferably comprises a pair of low voltage NMOS devices M1N1 and M1N2. The low voltage devices, having a lower threshold voltage (e.g., about 0.35 volt) compared to a high voltage device, provide the input stage 402 with additional overdrive so as to ensure proper operation of the translator circuit 400 over a desired range of process, voltage and/or temperature (PVT) variations. Each of devices M1N1 and M1N2 includes a source, a drain and a gate terminal, with the source terminals of M1N1 and M1N2 connecting to a first voltage providing a first voltage, which is VSS. The gate terminal of M1N1 preferably receives input signal A and the gate terminal of M1N2 receives input signal AN. The drain terminals of M1N1 and M1N2 are connected to the voltage clamp 406 at nodes i4 and i3, respectively. The respective sizes of M1N1 and M1N2 are preferably chosen so as to provide sufficient overdrive capability under substantially all expected worst case PVT corners of the translator circuit 400.

Since devices M1N1 and M1N2 are low voltage devices, voltage clamp 406 preferably serves as a primary means for preventing the voltage at nodes i3 and i4 from exceeding a maximum specified voltage limit for the low threshold devices (e.g., about 1.26 volts for this exemplary embodiment). In this manner, devices M1N1 and M1N2 are protected from voltage overstress which can lead to device failure and/or reliability problems. Voltage clamp 406 preferably comprises a pair of high voltage NMOS transistor devices M3N1 and M3N2. As previously explained, high voltage devices typically have threshold voltages that are substantially higher compared to low voltage devices (e.g., about 0.75 volt) for a given integrated circuit process. The voltage clamp 406 is preferably configured such that a source terminal of M3N1 is connected to the drain terminal of M1N1 at node i4, a source terminal of M3N2 is connected to the drain terminal of M1N2 at node i3, and drain terminals of M3N1 and M3N2 are connected to the latch circuit 404 at nodes i1 and i2, respectively. Gate terminals of M3N1 and M3N2 are preferably connected to the bias signal VREF for selectively controlling the voltages at corresponding nodes i4 and i3.

The latch circuit 404 in the translator circuit 400 is operative for storing a voltage level translated signal AN' at node i1 which is representative of a logical state of the input signal A or AN presented to the translator circuit. Because latch circuit 404 includes two nodes, namely, nodes i1 and i2, the latch circuit may be referred to as a differential latch. The latch circuit 404 preferably comprises a pair of high voltage PMOS transistors M3P1 and M3P2 connected in a cross-coupled arrangement. Specifically, source terminals of transistors M3P1 and M3P2 are connected to VDDIO, a drain terminal of M3P1 is connected to a gate terminal of M3P2 at node i1, and a drain terminal of M3P2 is connected to a gate terminal of M3P1 at node i2. It is to be understood that alternative latch circuit arrangements as may be known by those skilled in the art are similarly contemplated by the invention.

The output stage 410 preferably has an input coupled to node i1 and an output at node i5 for generating the output signal Z based on at least one of the input signals A and AN. The output stage 410 comprises a high voltage PMOS transistor M3P3 and a high voltage NMOS transistor M3N3 configured as a standard inverter, although alternative circuit configurations are similarly contemplated by the invention. Specifically, a source terminal of M3P3 is connected to VDDIO, a source terminal of M3N3 is connected to VSS. Gate terminals of transistors M3P3 and M3N3 are connected together to form the input of output stage 410 at node i1, and drain terminals of M3P3 and M3N3 are connected together at node i5 to form the output of the translator circuit 400.

As previously stated, the translator circuit 400 is selectively operable in one of at least two modes. When in the first mode, the translator circuit 400 preferably utilizes the input stage 402, latch circuit 404, and voltage clamp 406 to translate input signal A, referenced to VDDCORE, to output signal Z, referenced to VDDIO. When in the second mode, the translator circuit 400 is preferably operative to provide a direct signal path between the input and output of the translator circuit without performing voltage level translation. The first mode may be defined, for example, by the condition that a difference between VDDIO and VDDCORE is less than a certain specified voltage level. Likewise, the second mode may be indicative of the difference between VDDIO and VDDCORE being greater than or equal to the specified voltage level.

In order to selectively provide a direct signal path between the input and output, the exemplary translator circuit 400 includes a bypass circuit 412. The bypass circuit 412 is preferably operative to receive the input signal A, or alternatively signal AN, and the voltage level translated signal AN' stored by the latch circuit 404 at node i1. The bypass circuit 412 is further operative to selectively output either the voltage level translated signal AN' or the input signal A (or a logical complement thereof), which is not voltage level translated, in response to one or more control signals presented to the bypass circuit. Thus, the bypass circuit 412 functions essentially as a multiplexer to select, as its output, one of a plurality of input signals presented to the bypass circuit depending on the mode of operation of the translator circuit 400. Node i1 is essentially a wired-OR node, with the voltage at node i1 being determined either by the latch circuit 404 (e.g., in the first mode) or by the bypass circuit 412 (e.g., in the second mode), depending on the mode of operation of the translator circuit 400.

In a preferred embodiment of the invention, the bypass circuit 412 comprises a gated inverter including a first high voltage PMOS device M3PBYP2a first high voltage NMOS device M3NBYN2 connected together in an inverter configuration. Specifically, gate terminals of M3PBYP2 and M3NBYN2 are connected together to form an input of the gated inverter for receiving input signal A, and drain terminals of M3PBYP2 and M3NBYN2 are connected together to form an output of the gated inverter which is connected to node i1. A source terminal of M3NBYN2 is connected to a drain terminal of a second high voltage NMOS device M3NBYN1, a source terminal of M3NBYN1 connects to VSS, and a gate terminal of M3NBYN1 receives a first control signal V1. Similarly, a source terminal of M3PBYP2 is connected to a drain terminal of a second high voltage PMOS device M3PBYP1, a source terminal of M3PBYP1 connects to VDDIO, and a gate terminal of M3PBYP1 receives a second control signal V2. Preferably, control signals V1 and V2 are logical complements of one another, such that devices M3PBYP1 and M3NBYN1 are either both on or both off at any given time. Devices M3PBYP1 and M3NBYN1 essentially function as switches for selectively powering up the core inverter comprising devices M2PBYP2 and M3NBYN2.

By way of example only, the basic operation of the translator circuit 400 will now be described. It is assumed that in the first mode, VDDIO is substantially higher than VDDCORE (e.g., greater than or equal to about 0.75 volt), and therefore voltage level translation is required. Likewise, it is assumed that in the second mode, the magnitude of VDDIO is comparable to the magnitude of VDDCORE in terms of voltage level (e.g., less than about 0.75 volt), so that no voltage level translation is required. In the first mode, control signal V1 is preferably a logic low and control signal V2 is a logic high, thereby turning off the gated inverter in bypass circuit 412. The reference circuit 306 shown in FIG. 3 is preferably operative to receive at least one of the control signals V1, V2 (e.g., V1) and to generate the bias signal VREF in the first mode (e.g., when V1 is a logic low). In the second mode, control signal V1 is preferably a logic high and control signal V2 is a logic low, thereby turning on the gated inverter in bypass circuit 412. The reference circuit 306 of FIG. 3 is preferably configured such that the bias signal VREF is pulled to zero in the second mode, thereby effectively turning off the voltage clamp 406 and input stage 402 in the translator circuit 400 and allowing node i1 to float.

In the first mode, when input signal A is a logic high transistor M1N1 will turn on, thereby pulling nodes i4 and i1 low. Node i1 being low forces output signal Z to a logic high. Node i1 being low also turns on transistor M3P2, thereby pulling node i2 high and turning off transistor M3P1. Signal AN, being a complement of signal A, will be a logic low, thereby turning off transistor M1N2. With transistor M1N2 being turned off, node i2 is allowed to be pulled high by M3P2. Similarly, when signal A is low, transistor M1N1 is turned off. Signal AN, being a complement of signal A, will be high, thereby turning on transistor M1N2 and pulling nodes i3 and i2 low. Once node i2 falls about a threshold voltage below VDDIO, transistor M3P1 turns on, thereby pulling node i1 high and turning off transistor M3P2. Node i1 being high forces output signal Z to a logic low. With control signal V1 being a logic low and control signal V2 being a logic high, transistors M3PBYP1 and M3NBYN1 are turned off, thereby disabling the bypass circuit 412. In the first mode, since the gated inverter in bypass circuit 412 is turned off, the junction of the drain terminals of transistors M2PBYP2 and M3NBYN2 will essentially float and therefore node i1 will be controlled by the latch circuit 404.

In the second mode, the bias signal VREF is zero, thereby turning off the voltage clamp 406 and input stage 402 and allowing the output of the latch circuit 404 at node i1 to float. With control signal V1 being high and control signal V2 being low, however, the bypass circuit 412 is enabled, so that the voltage at node i1 will be a logical complement of the input signal A. The voltage at node i1 is subsequently inverted by the output stage 410 to generate the output signal Z which follows the same polarity as input A. A signal path through the bypass circuit 412 has significantly less skew compared to a signal path through the input stage 402, voltage clamp 406 and latch circuit 404.

Figure 5:
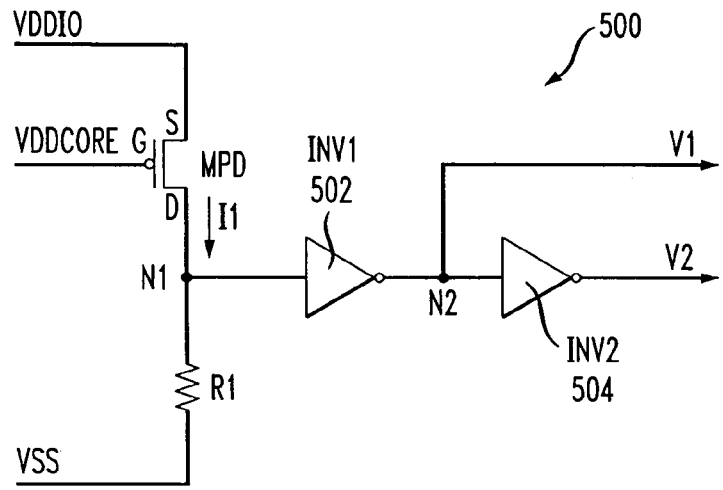
FIG. 5 is a schematic diagram illustrating an exemplary voltage detector suitable for use with the voltage level translator circuit shown in FIG. 3.

FIG. 5 is a schematic diagram depicting an exemplary voltage detector 500, formed in accordance with an illustrative embodiment of the invention. Voltage detector 500 may be suitable for use in the voltage level translator circuit 300 shown in FIG. 3, although alternative voltage detection circuitry is similarly contemplated. The exemplary voltage detector 500 is operative to measure a difference between VDDIO and VDDCORE and to generate the one or more control signals V1, V2 used to select the mode of operation of the voltage level translator circuit 300 (see FIG. 3).

The voltage detector 500 preferably comprises a high voltage PMOS transistor device MPD, including a source terminal connecting to VDDIO, a gate terminal connecting to VDDCORE, and a drain terminal connected, at node N1, to a first end of a resistor R1 having a substantially high resistance associated therewith (e.g., greater than about 10,000 ohms). The amount of current I1 flowing through transistor MPD can be controlled, at least in part, by a sizing (e.g., channel width-to-length (W/L) ratio) of MPD as well as the resistance of resistor R1. A second end of resistor R1 may be connected to VSS, or an alternative voltage source. The exemplary voltage detector 500 further includes a pair of standard inverters 502 and 504 connected in series with one another. Specifically, an input of inverter 502 is connected to node N1 and an output of inverter 502 is connected to an input of inverter 504 at node N2. The output of inverter 502 generates the control signal V1, and an output of inverter 504 generates the control signal V2.

When VDDIO is comparable to VDDCORE, such as when VDDIO is less than about a threshold voltage (e.g., about 0.75 volt) above VDDCORE, transistor MPD will be turned off and the current I1 will be essentially zero. Node N1 will be pulled to VSS by resistor R1. Node N1 being a logic low will force control signal V1 high and control signal V2, being a logical complement of V1, will be low. As previously stated, this may be defined as the second mode (bypass mode) of operation of the voltage level translator circuit 300 (see FIG. 3). Likewise, when VDDIO is substantially greater than about a threshold voltage above VDDCORE, transistor MPD turns on, thereby pulling node N1 high. Node N1 being high forces control signal V1 low and control signal V2 high. As previously stated, this may be defined as the first mode (normal mode) of operation. It is to be understood that one such voltage detector 500 may be used to generate the control signals V1, V2 for a plurality of voltage level translator circuits, as may be employed in a single integrated circuit device.

Figure 6:
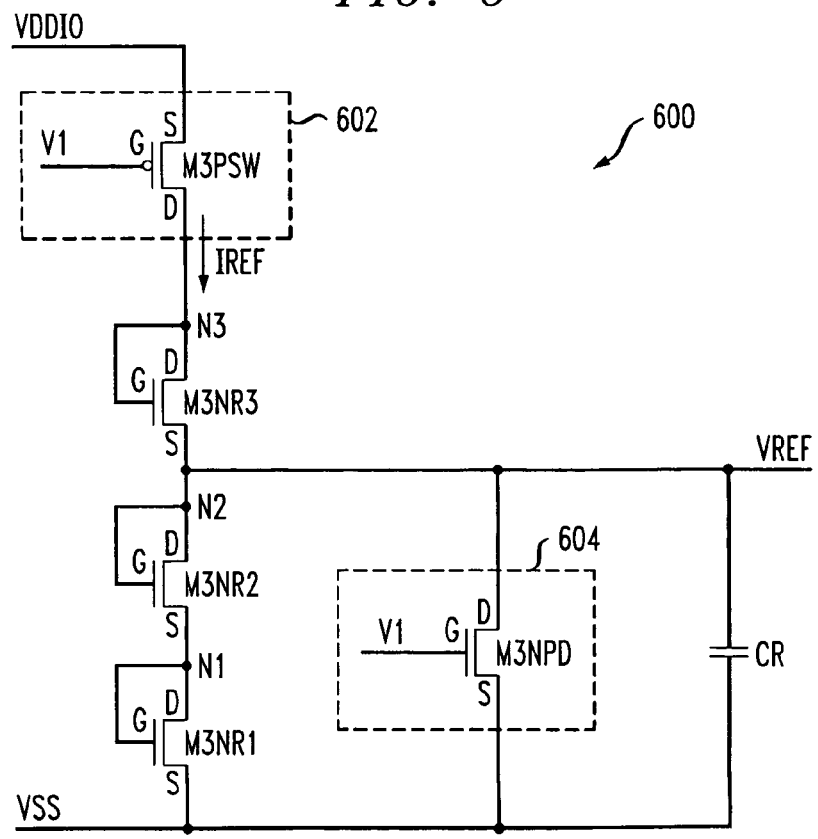
FIG. 6 is a schematic diagram illustrating an exemplary reference circuit suitable for use with the voltage level translator circuit shown in FIG. 3.
Figure 4:
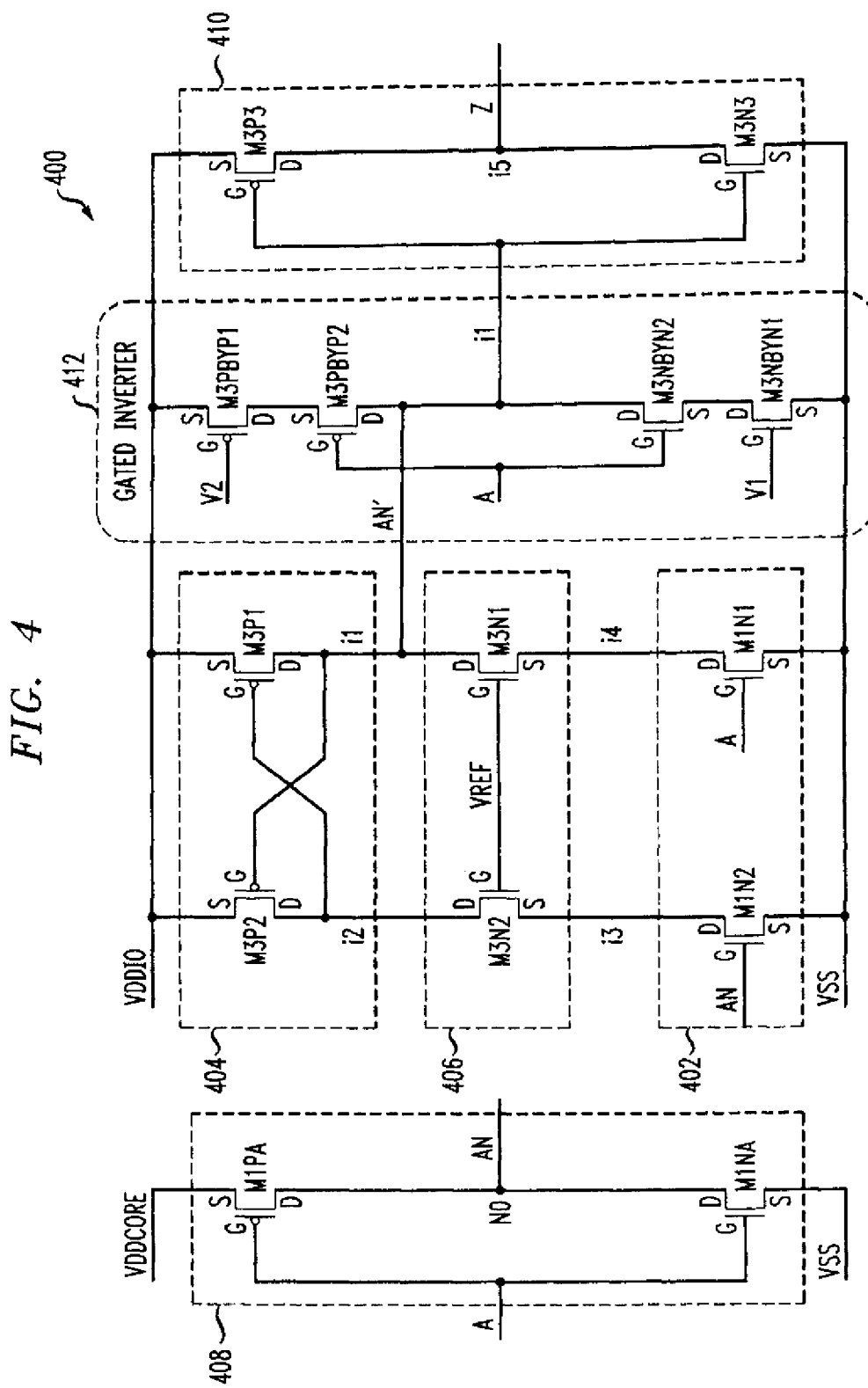

FIG. 6 is a schematic diagram depicting an exemplary reference circuit 600, formed in accordance with an illustrative embodiment of the invention. Reference circuit 600 is one implementation of the reference circuit 306 employed in the voltage level translator circuit 300 shown in FIG. 3. The present invention, however, is not limited to the reference circuit arrangement shown. The reference circuit 600 is operative for providing the bias signal VREF used to clamp the voltage appearing at nodes i3 and i4 of the illustrative translator circuit 400 shown in FIG. 4. The exemplary reference circuit 600, like the reference circuit 200 depicted in FIG. 2, may be implemented as simple voltage divider circuit including three diode-connected high voltage NMOS transistor devices, namely, M3NR1, M3NR2 and M3NR3, arranged in a stacked configuration. Specifically, gate and drain terminals of M3NR1 are connected to a source terminal of M3NR2 at node N1, a source terminal of M3NR1 is connected to VSS, gate and drain terminals of M3NR2 are connected to a source terminal of M3MR3 at node N2, and gate and drain terminals of M3MR3 are connected together at node N3. In order to reduce noise which may be introduced into the bias signal VREF, a capacitor CR is preferably included between node N2 and an alternating current (AC) ground, such as, for example, VSS. The value of capacitor CR is preferably chosen as a function of the desired frequency components to be attenuated.

Node N3 is connected to VDDIO through a first switch 602 preferably implemented as a high voltage PMOS transistor device M3PSW, or an alternative switching arrangement. Device M3PSW includes a drain terminal connected to node N3, a source terminal connecting to VDDIO and a gate terminal connecting to the first control signal V1 generated by the voltage detector 304 shown in FIG. 3. Transistor M3PSW is preferably a long channel device so as to limit the DC power consumption in the reference circuit 600 when activated. By gating transistor M3PSW with control signal V1, at least a portion of the reference circuit 600 (e.g., the voltage divider stack) can be selectively turned off, such as, for example, during the second mode of operation, so as to reduce overall power consumption in the voltage level translator circuit when voltage level translation is not required.

When M3PSW is turned off, a current Iref flowing in the voltage divider stack will be substantially zero. Consequently, node N2 will float, and thus the bias signal VREF generated at node N2 may be undetermined. In order to define the bias signal VREF when M3PSW is turned off, a second switch 604, implemented as a high voltage NMOS device M3NPD or an alternative switching arrangement, may be connected between node N2 and a reference source, preferably VSS. Specifically, a drain terminal of M3NPD is connected to node N2, a source terminal of M3NPD is connected to VSS, and a gate terminal of M3NPD receives control signal V1. Alternative circuitry may be employed for setting the bias signal VREF to a specified value, as will be known by those skilled in the art. For example, a PMOS device (not shown) may be connected between node N2 and VSS, the PMOS device being gated by the second control signal V2. Second switch 604 is preferably disabled when first switch 602 is enabled, and vice versa.

It is to be appreciated that the self-bypassing voltage level translation techniques of the present invention described herein may be used with alternative circuit configurations for translating among other voltage levels, as will be apparent to those skilled in the art. For example, a translator circuit (not shown) may be employed comprising transistor devices having polarities opposite to the polarities of the transistor devices in translator circuit 400 depicted in FIG. 4, as will be understood by those skilled in the art.

At least a portion of the voltage level translator circuit of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A voltage level translator circuit selectively operable in one of at least two modes in response to a control signal, wherein in a first mode the translator circuit is operative to translate an input signal referenced to a first source providing a first voltage to an output signal referenced to a second source providing a second voltage, and in a second mode the translator circuit is operative to provide a signal path from an input of the voltage translator circuit to an output thereof without translating the input signal, the control signal being indicative of a difference between the first voltage and the second voltage.

2. The circuit of claim 1, further comprising a voltage detector operative to measure the difference between the first voltage and the second voltage and to generate the control signal.

3. The circuit of claim 1, wherein the control signal is indicative of at least one of:
(i) whether or not the difference between the first and second voltages is less than a specified amount; and (ii) whether or not the difference between the first and second voltages is about equal to the specified amount.

4. The circuit of claim 1, further comprising a reference circuit selectively operable in one of at least the first mode and the second mode in response to the control signal, wherein in the first mode the reference circuit is operative to provide a bias signal to the voltage level translator circuit, and in the second mode the reference circuit is operative to turn off at least a portion of the voltage level translator circuit.

5. The circuit of claim 4, wherein the reference circuit comprises:
a voltage divider circuit connected between the second source and a third source providing a third voltage, the third voltage being less than the second voltage, the divider circuit being configured to generate the bias signal at an output of the reference circuit, the bias signal being a function of at least the second voltage;
a first switch connected between the voltage divider circuit and the second source, the first switch being selectively operable in one of at least the first and second modes in response to the control signal, wherein in the first mode the first switch is operative to electrically connect the voltage divider circuit to the second source, and in the second mode the first switch is operative to disconnect the voltage divider circuit from the second source; and
a second switch selectively operable in one of at least the first and second modes in response to the control signal, wherein in the first mode the second switch is turned off, and in the second mode the second switch is operative to provide an electrical connection between the output of the reference circuit and the third source.

6. The circuit of claim 5, wherein the voltage divider circuit comprises:
a first NMOS device including a first source/drain terminal connecting to a third source providing a third voltage, and a gate terminal of the first NMOS device connected to a second source/drain terminal of the first NMOS device;
a second NMOS device, including a first source/drain terminal connected to the second source/drain terminal of the first NMOS device, and a gate terminal of the second NMOS device connected to a second source/drain terminal of the second NMOS device and forming the output of the reference circuit; and
a third NMOS device, including a first source/drain terminal connected to the second source/drain terminal of the second NMOS device, a gate terminal of the third NMOS device being connected to a second source/drain terminal of the third NMOS device, and the second source/drain terminal of the third NMOS device being connected to the first switch.

7. The circuit of claim 5, wherein the first switch comprises a PMOS device including a first source/drain terminal connected to the voltage divider circuit, a gate terminal for receiving the first control signal, and a second source/drain terminal connecting to the second source.

8. The circuit of claim 5, wherein the second switch comprises an NMOS device including a first source/drain terminal connecting to the third source, a gate terminal receiving the first control signal, and a second source/drain terminal connected to the output of the reference circuit.

9. The circuit of claim 1, wherein the voltage level translator circuit comprises:
an input stage for receiving the input signal, the input stage including at least one transistor device having a first threshold voltage associated therewith;
a latch circuit operative to store a signal representative of a logical state of the input signal, the latch circuit including at least one transistor device having a second threshold voltage associated therewith, the second threshold voltage being greater than the first threshold voltage;
a voltage clamp connected between the input stage and the latch circuit, the voltage clamp being configured to limit a voltage across the input stage based, at least in part, on a bias signal presented to the voltage clamp, wherein in the second mode the voltage clamp is operative to turn off at least a portion of the voltage translator cell; and a bypass circuit selectively operable in one of at least the first mode and second mode in response to the control signal, wherein in the first mode at least a portion of the bypass circuit is turned off and an output signal generated by the bypass circuit is substantially equal to the signal stored in the latch circuit, and in the second mode the bypass circuit is operative to receive the input signal and to generate an output signal without translation.

10. The circuit of claim 9, wherein the input stage comprises first and second transistor devices, each transistor device including first and second source/drain terminals and a gate terminal, the first source/drain terminals connecting to a third source providing a third voltage, the second source/drain terminals being connected to the latch circuit, the gate terminal of the first transistor device receiving the input signal, and the gate terminal of the second transistor device receiving a logical complement of the input signal.

11. The circuit of claim 9, wherein the latch circuit comprises first and second transistor devices, each transistor device including first and second source/drain terminals and a gate terminal, the first source/drain terminals connecting to the second source, the second source/drain terminals being connected to the input stage, the gate terminal of the first transistor device being connected to the second source/drain terminal of the second transistor device, and the gate terminal of the second transistor device being connected to the second source/drain terminal of the first transistor device.

12. The circuit of claim 9, further comprising an output stage including an input coupled to the latch circuit, for receiving the output signal generated by the bypass circuit, and an output for generating an output signal of the voltage level translator circuit.

13. The circuit of claim 9, wherein the bypass circuit comprises a multiplexer including at least first and second inputs and an output, the first input receiving the signal stored in the latch circuit, the second input receiving the input signal, the multiplexer selecting one of the first input and the second input to be passed to the output of the multiplexer in response to the control signal.

14. The circuit of claim 9, wherein the bypass circuit comprises first and second PMOS devices and first and second NMOS devices, a first source/drain terminal of the first NMOS device connecting to a third source providing a third voltage, a gate terminal of the first NMOS device receiving the control signal, a, second source/drain terminal of the first NMOS device being connected to a first source/drain terminal of the second NMOS device, a second source/drain terminal of the second NMOS device and a first source/drain terminal of the first PMOS device being connected together at an output of the bypass circuit and receiving the signal stored in the latch circuit, gate terminals of the second NMOS device and first PMOS device being connected together and receiving the input signal, a second source/drain terminal of the first PMOS device being connected to a first source/drain terminal of the second PMOS device, a gate terminal of the second PMOS device receiving a logical complement of the control signal, and a second source/drain terminal of the second PMOS device connecting to the second source.

15. The circuit of claim 1, wherein the control signal is indicative of at least one of:
(i) whether or not the difference between the first voltage and the second voltage is less than about a transistor threshold voltage; and (ii) whether or not the difference between the first voltage and the second voltage is about equal to a transistor threshold voltage.

16. The circuit of claim 2, wherein the voltage detector comprises:
a transistor device including a first source/drain terminal connecting to the second source, and a gate terminal connecting to the first source;
a load device connecting, at a first end, to a third source providing a third voltage, the third voltage being less than the first voltage, and a second end of the load device being connected to a second source/drain terminal of the transistor device; and
at least a first inverter including an input connected to the second source/drain terminal of the transistor device and an output for generating the control signal.

17. The circuit of claim 1, wherein the first voltage is nominally about 1.0 volt and the second voltage is nominally about 3.3 volts.

18. An integrated circuit, comprising:
at least one voltage level translator circuit, the at least one voltage level translator circuit being selectively operable in one of at least two modes in response to a control signal, wherein in a first mode the translator circuit is operative to translate an input signal referenced to a first source providing a first voltage to an output signal referenced to a second source providing a second voltage, and in a second mode the translator circuit is operative to provide a signal path from an input of the voltage translator circuit to an output thereof without translating the input signal, the control signal being indicative of a difference between the first voltage and the second voltage.

19. The integrated circuit of claim 18, wherein the at least one voltage level translator circuit further comprises a voltage detector operative to measure the difference between the first voltage and the second voltage and to generate the control signal.

20. The integrated circuit of claim 18, wherein the at least one voltage level translator circuit further comprises a reference circuit selectively operable in one of at least the first mode and the second mode in response to the control signal, wherein in the first mode the reference circuit is operative to provide a bias signal to the voltage level translator circuit, and in the second mode the reference circuit is operative to turn off at least a portion of the voltage level translator circuit.

* * * * *

UNITED STATES PATENT AND TRADEMARK OFFICE
CERTIFICATE OF CORRECTION

PATENT NO. : 7,145,364 B2  
APPLICATION NO. : 11/065785  
DATED : December 5, 2006  
INVENTOR(S) : D. Bhattacharya et al.

It is certified that error appears in the above-identified patent and that said Letters Patent is hereby corrected as shown below:

In the Drawings

The drawing sheet 3 of 4 consisting of Fig(s) 4 should be deleted and substitute therefore the attached drawing sheet 3 of 4 consisting of Fig(s) 4.

Signed and Sealed this  
Twenty-fourth Day of April, 2012

David J. Kappos  
*Director of the United States Patent and Trademark Office*